(12) United States Patent
Iwabuchi et al.

(10) Patent No.: US 9,093,432 B2
(45) Date of Patent: Jul. 28, 2015

(54) SEMICONDUCTOR DEVICE

(75) Inventors: Akio Iwabuchi, Niiza (JP); Hironori Aoki, Niiza (JP)

(73) Assignee: SANKEN ELECTRIC CO., LTD., Saitama (JP)

(*) Notice: Subject to any disclaimer, the term of this patent is extended or adjusted under 35 U.S.C. 154(b) by 0 days.

(21) Appl. No.: 13/243,596

(22) Filed: Sep. 23, 2011

(65) Prior Publication Data

US 2013/0075925 A1 Mar. 28, 2013

(51) Int. Cl.
*H01L 23/482* (2006.01)
*H01L 29/40* (2006.01)
*H01L 23/00* (2006.01)

(52) U.S. Cl.
CPC .......... *H01L 23/4824* (2013.01); *H01L 29/404* (2013.01); *H01L 24/05* (2013.01); *H01L 2224/04042* (2013.01); *H01L 2224/05553* (2013.01); *H01L 2224/05624* (2013.01); *H01L 2224/05647* (2013.01); *H01L 2224/05666* (2013.01)

(58) Field of Classification Search
CPC ..... H01L 29/402; H01L 29/404; H01L 23/48; H01L 23/4824
USPC .................. 257/774, 686, 690, 784, E23.142, 257/E23.169, 339, 341–343, 40, 762, 779, 257/699, 700, 296, 300, 734, 758, E23.011, 257/E29.256, 488
See application file for complete search history.

(56) References Cited

U.S. PATENT DOCUMENTS 4,766,474 A * 8/1988 Nakagawa et al. ........... 257/409
7,109,562 B2 * 9/2006 Lee ................................ 257/488
(Continued)

FOREIGN PATENT DOCUMENTS

JP 4-192425 A 7/1992
JP 8-97339 A 4/1996
(Continued)

OTHER PUBLICATIONS

Rajabi, S.; Orouji, A.A.; Moghadam, H.A.; Mahabadi, S.E.J.; Fathipour, M.; , "A novel double field-plate power high electron mobility transistor based on AlGaN/GaN for performance improvement," Signal Processing, Communication, Computing and Networking Technologies (ICSCCN), 2011 International Conference on , vol., No., pp. 272-276, Jul. 21-22, 2011.*

*Primary Examiner* — Zandra Smith
*Assistant Examiner* — Lauren R Bell
(74) *Attorney, Agent, or Firm* — Birch, Stewart, Kolasch & Birch, LLP

(57) ABSTRACT

A semiconductor device is free from degradation of characteristics attributable to a manufacturing process thereof and its characteristics are hardly affected by changes in electric potentials of bonding pads. The semiconductor device 10 includes an active region 12, a first insulating layer 13 covering the active region 12, a floating conductor 14 formed on the first insulating layer 13, a second insulating layer 15 formed on the first insulating layer 13 and the floating conductor 14, a bonding pad 18 formed on the second insulating layer 17 and interconnection vias 19, 20 for electrically connecting the active region 12 and the bonding pad 18.

1 Claim, 7 Drawing Sheets

(56) References Cited

U.S. PATENT DOCUMENTS

| | | | |
|---|---|---|---|
| 7,119,440 B2 * | 10/2006 | Huang | 257/751 |
| 2004/0201078 A1 * | 10/2004 | Ren | 257/500 |
| 2005/0242438 A1 * | 11/2005 | Cathelin et al. | 257/758 |
| 2005/0280149 A1 | 12/2005 | Tsutsui et al. | |
| 2007/0194354 A1 * | 8/2007 | Wu et al. | 257/288 |
| 2008/0185724 A1 * | 8/2008 | Tseng et al. | 257/762 |
| 2009/0039425 A1 * | 2/2009 | Shu et al. | 257/339 |
| 2009/0256212 A1 * | 10/2009 | Denison et al. | 257/408 |
| 2010/0065954 A1 * | 3/2010 | Tu et al. | 257/686 |
| 2010/0289151 A1 * | 11/2010 | Chida et al. | 257/773 |

FOREIGN PATENT DOCUMENTS

| | | |
|---|---|---|
| JP | 2005-166959 A | 6/2005 |
| JP | 2005-209983 A | 8/2005 |
| JP | 2005-236277 A | 9/2005 |
| JP | 2006-5202 A | 1/2006 |
| JP | 2006-32552 A | 2/2006 |
| JP | 2006-339406 A | 12/2006 |
| JP | 2007-87975 A | 4/2007 |
| JP | 2007-180143 A | 7/2007 |
| JP | 2009-124002 A | 6/2009 |
| JP | 2010-147062 A | 7/2010 |

* cited by examiner

SEMICONDUCTOR DEVICE

BACKGROUND OF THE INVENTION

1. Field of the Invention

The present invention relates to a semiconductor device. More particularly, it relates to a semiconductor device equipped with bonding pads on an active region thereof where active elements such as transistors are arranged.

2. Description of the Related Art

There has been a trend of downsizing of various devices in recent years and semiconductor devices to be incorporated therein are required to be also downsized. Particularly, compound semiconductor devices capable of operating for switching a high voltage and a large electric current if compared with silicon semiconductor devices are required to be downsized in response to a trend of development of high density switching power supply devices adapted to higher power supplies because power semiconductor devices are utilized there as switching elements. However, while an active region (of switching power supply devices) where active elements such as transistors and integrated circuits are arranged can be downsized to a certain extent, bonding pads for connecting active elements such as transistors and integrated circuits and packages and mounted substrates typically by wire bonding are arranged in a region surrounding the active region and a relatively large metal surface is required for wire bonding so that it is not easy for a semiconductor device to be downsized as a whole.

To date, two methods have been proposed to arrange bonding pads for a semiconductor device that needs to be downsized. One is a method of arranging some of the bonding pads at the backside of the substrate (see, for example, Patent Document 1: Jpn. Pat. Appln. Laid-Open Publication No. 2009-124002) and the other is a method of arranging some of the bonding pads above the active region thereof (see, for example, Patent Document 2: Jpn. Pat. Appln. Laid-Open Publication No. 2005-166959 and Patent Document 3: Jpn. Pat. Appln. Laid-Open Publication No. 2006-5202).

Firstly, the method of arranging some of the bonding pads at the backside of a substrate will be described below. A semiconductor device to be used with this method has a structure in which a compound semiconductor layer is formed on an electroconductive substrate. Then, a groove running through the compound semiconductor layer and getting to the electroconductive substrate is formed in order to reduce the number of bonding pads and downsize the chip. A source electrode to be connected to the source region of the compound semiconductor layer and also to the electroconductive substrate and an insulating layer for electrically insulating the source electrode from the compound semiconductor layer other than the source region are formed in the inside of the groove. A semiconductor device having such a structure can be downsized by forming a back surface electrode on the back surface of the electroconductive substrate because the back surface electrode can be utilized as a bonding pad for the source electrode.

Now, the method of arranging some of the bonding pads above the active region will be described below. A semiconductor device to be used with this method has a semiconductor substrate with an active region and a first insulating layer for isolating the active region formed thereon, a second insulating layer formed on the semiconductor substrate including the active region and the first insulating layer, a wiring layer formed on the second insulating layer, a third insulating layer formed on the second insulating layer and the wiring layer, an interconnection via for electrically connecting the active region and the wiring layer, one or more first vias for reinforcement formed on the first insulating layer or the second insulating layer on the semiconductor substrate, a passivation layer and bonding pads, the passivation layer and the bonding pads being formed on the active region. This semiconductor device can be downsized by reducing the area of the bonding pads as the bonding pads are arranged on the active region.

For known semiconductor devices having a structure in which some of the bonding pads thereof are arranged on the backside of the substrate, the insulating layer formed in the inside of the groove running through the compound semiconductor layer and getting to the electroconductive substrate needs to be partly etched to form a source electrode by dry etching (RIE) a part of the insulating layer. At that time, dry etching of the insulating layer is an indispensable process, however, it is difficult to accurately conduct a process of dry etching the insulating layer and, if the dry etching process is not conducted accurately, some of the characteristics of the semiconductor device can degraded. More specifically, if the insulating layer is not sufficiently etched by dry etching, the insulating layer can partly remain between the source region of the compound semiconductor layer and the source electrode to give rise to a problem of raising the contact resistance of the source electrode. If, on the other hand, the insulating layer is excessively etched by dry etching, the surface of the compound semiconductor layer is damaged by dry etching to give rise to a problem of raising the channel resistance and generating electric current collapses.

For known semiconductor devices having a structure in which some of the bonding pads are arranged above the active region of the device, the semiconductor layer in the active region is affected by changes in the electric potentials of the bonding pads arranged above the active region to give rise to a problem that some of the characteristics of the semiconductor device can be degraded.

SUMMARY OF THE INVENTION

It is desirable to provide a downsized semiconductor device that is free from degradation of the characteristics attributable to the manufacturing process thereof and whose characteristics are hardly affected by changes in the electric potentials of the bonding pads.

According to the present invention, a semiconductor device is configured as described below.

A semiconductor device, which is referred to as a first semiconductor device according to the present invention hereinafter, includes:

an active region;
a first insulating layer covering the active region;
a floating conductor formed on the first insulating layer;
a second insulating layer formed on the first insulating layer and the floating conductor;
a bonding pad formed on the second insulating layer; and
an interconnection via for electrically connecting the active region and the bonding pad.

Thus, the present invention provides a semiconductor device that is free from degradation of the characteristics attributable to the manufacturing process thereof and whose characteristics are hardly affected by changes in the electric potentials of the bonding pads.

DETAILED DESCRIPTION OF THE PREFERRED EMBODIMENTS

Now, the present invention will be described in greater detail by referring to the accompanying drawings that schematically illustrate preferred embodiments (examples) of the invention.

Figure 1:
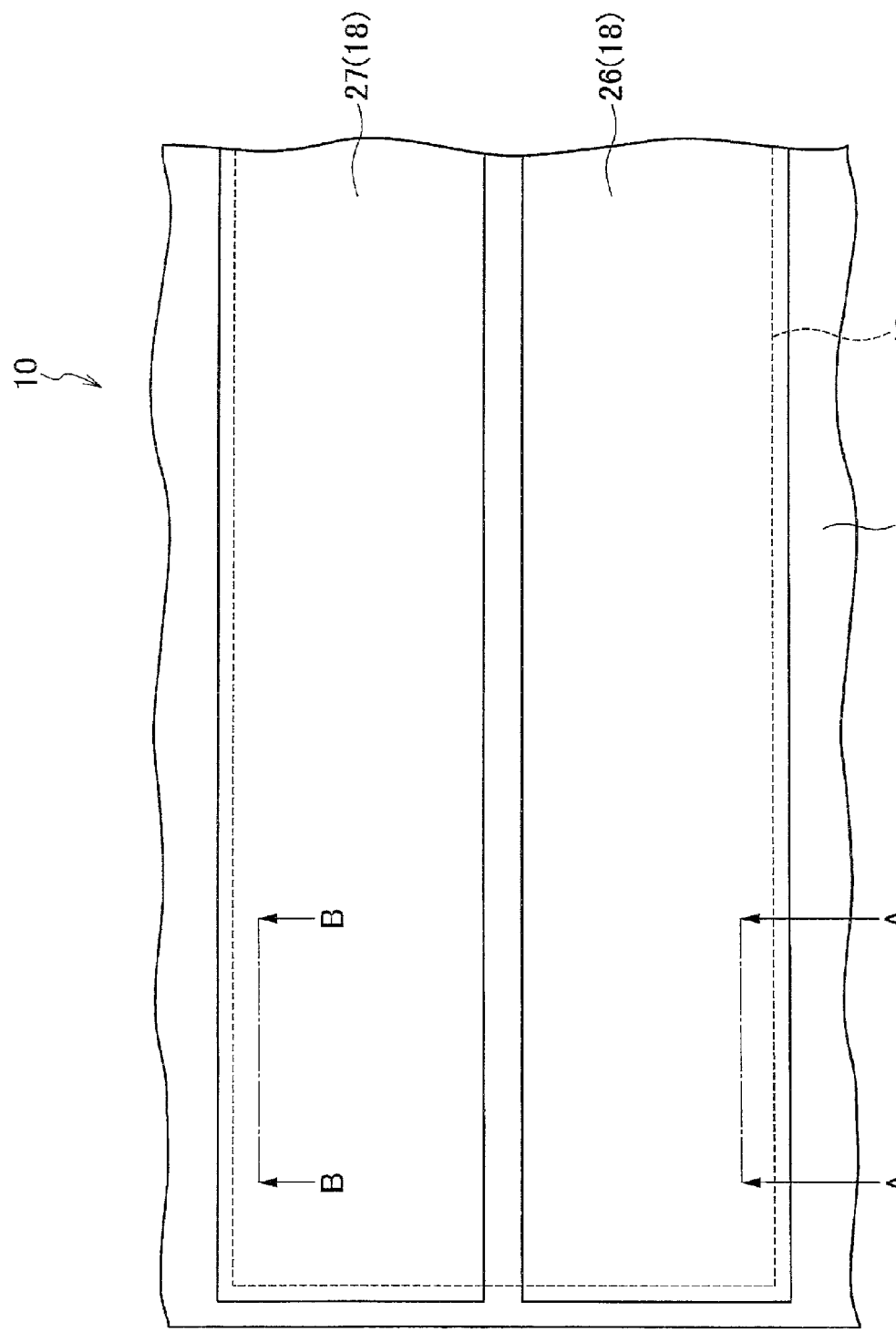
FIG. 1 is a schematic plan view of semiconductor device according to a first embodiment of the present invention.
Figure 2:
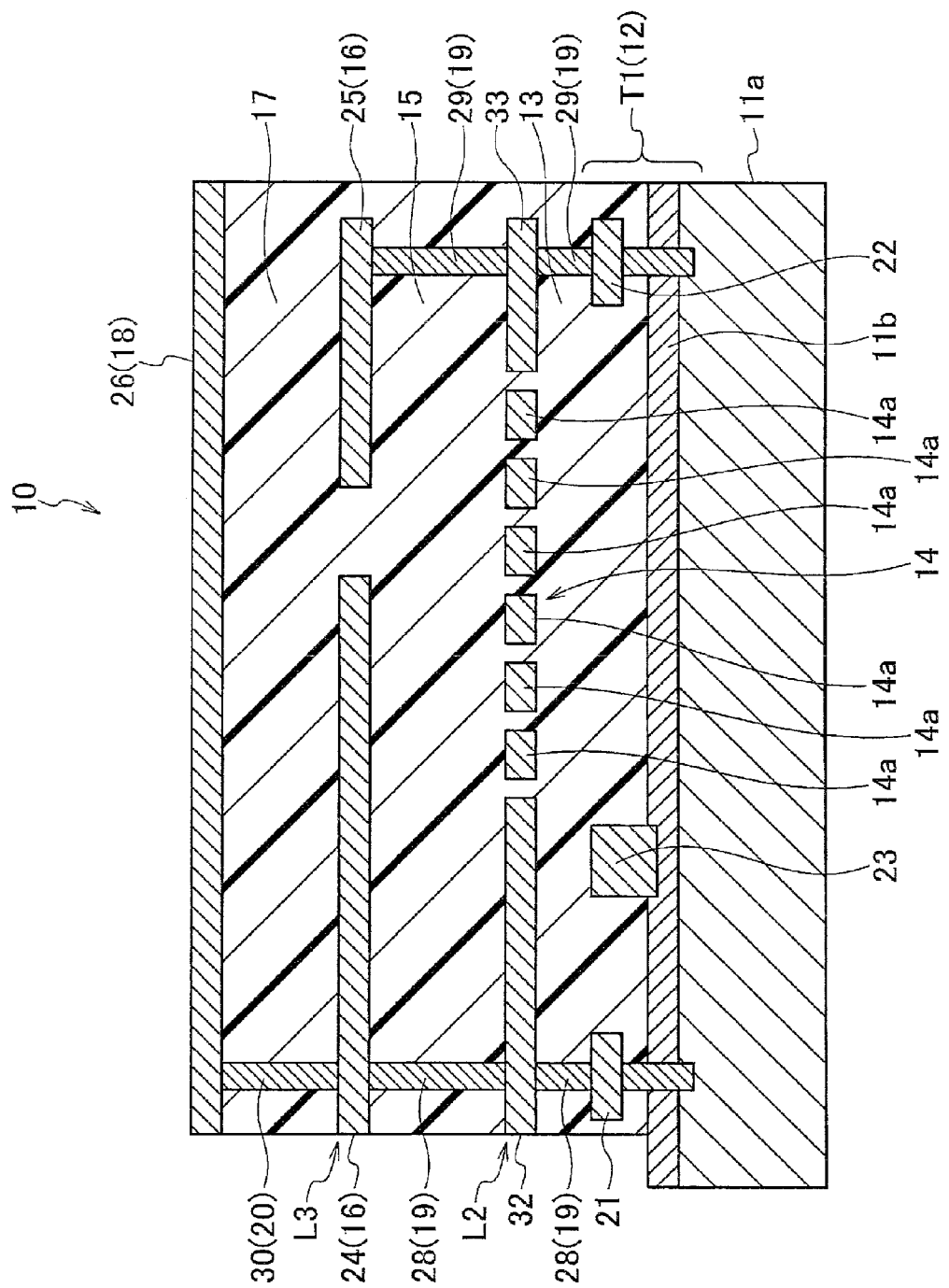
FIG. 2 is a schematic cross-sectional view taken along line A-A in FIG. 1.
Figure 3:
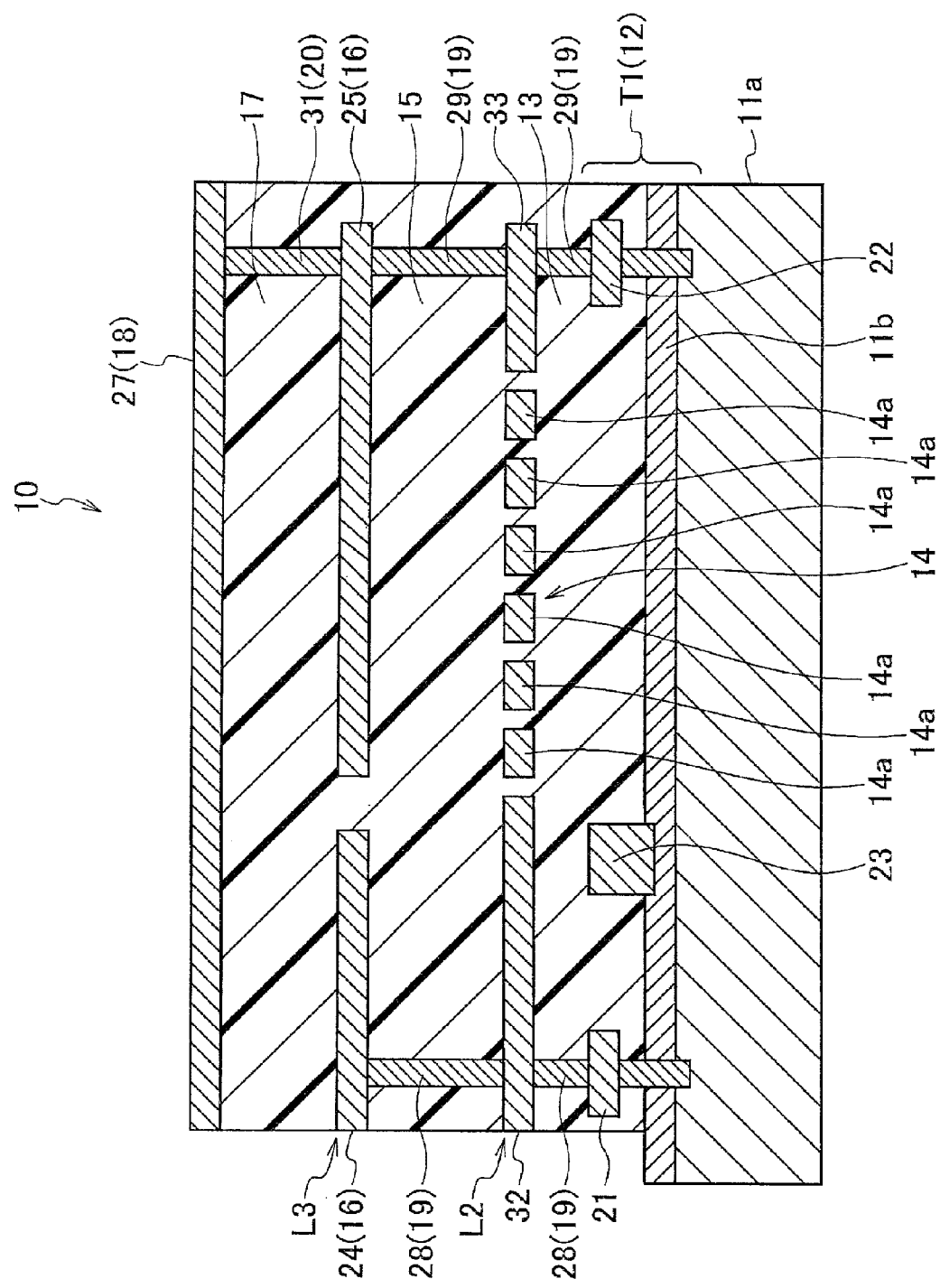
FIG. 3 is a schematic cross-sectional view taken along line B-B in FIG. 1.
Figure 4:
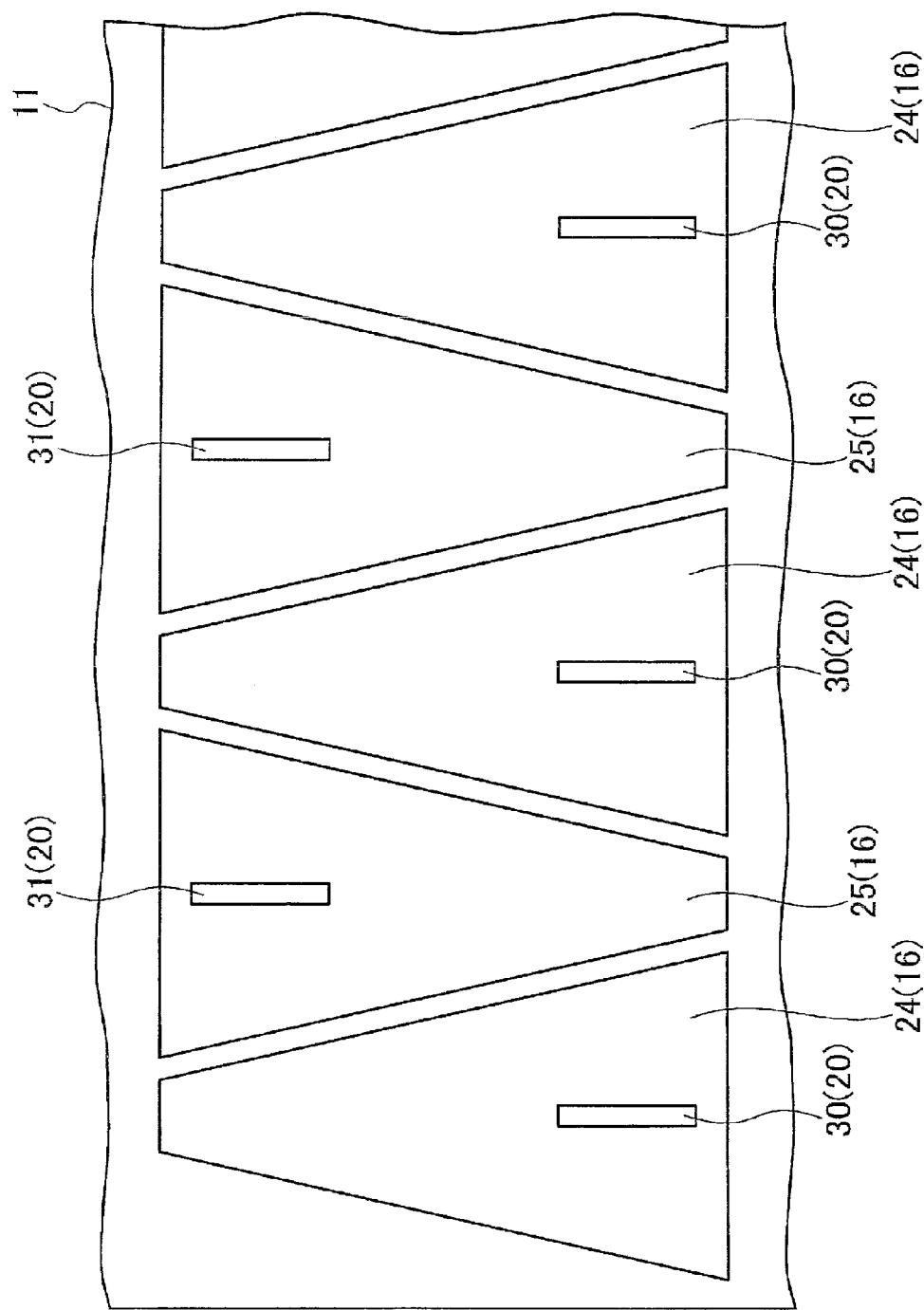
FIG. 4 is a schematic plan view of the third layer L3 shown in FIGS. 2 and 3.
Figure 5:
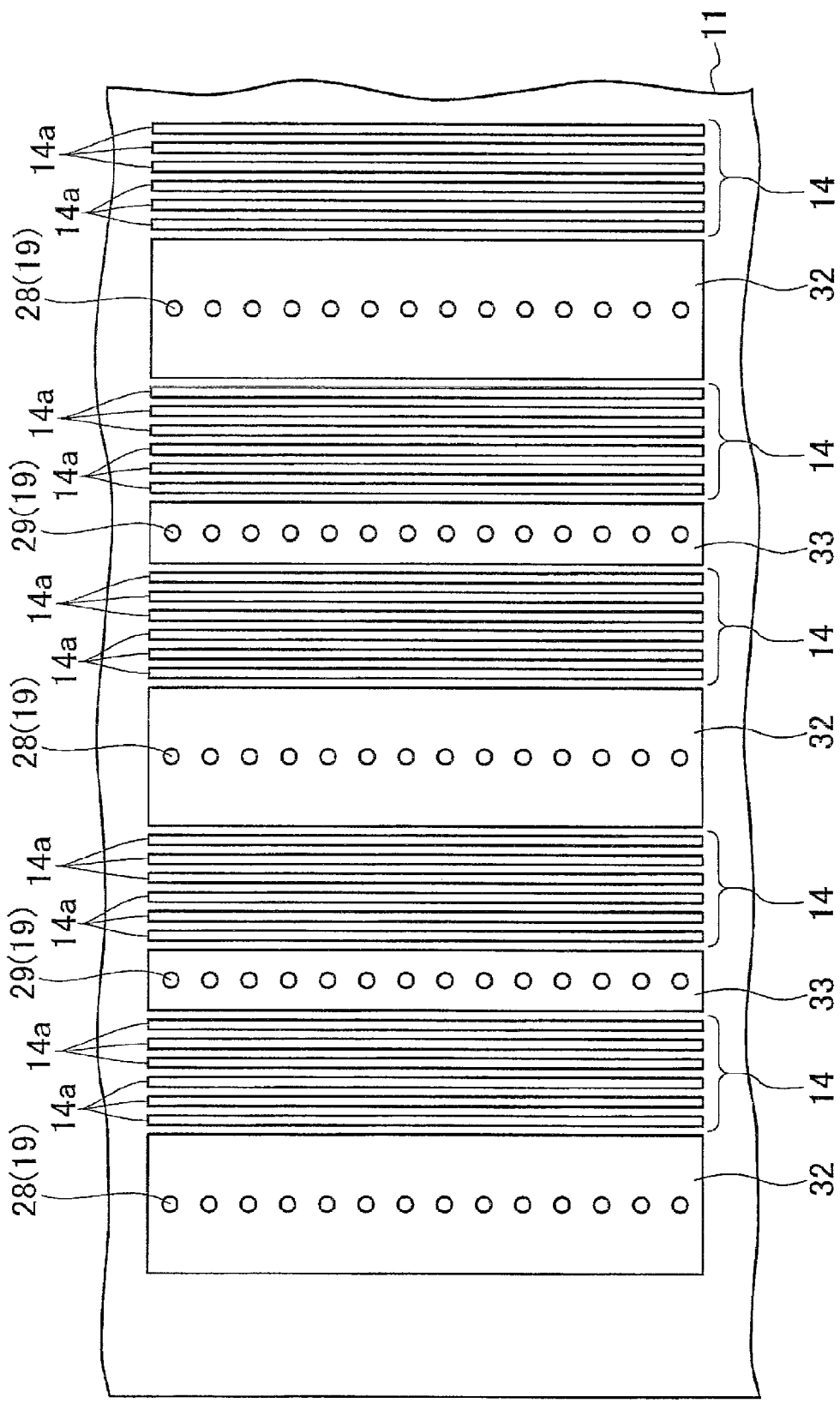
FIG. 5 is a schematic plan view of the second layer L2 shown in FIGS. 2 and 3.

FIG. 1 is a schematic plan view of semiconductor device according to the first embodiment of the present invention. FIG. 2 is a schematic cross-sectional view taken along line A-A in FIG. 1. FIG. 3 is a schematic cross-sectional view taken along line B-B in FIG. 1. FIG. 4 is a schematic plan view of the third layer L3 shown in FIGS. 2 and 3. FIG. 5 is a schematic plan view of the second layer L2 shown in FIGS. 2 and 3.

The semiconductor device 10 includes an active region 12 formed on a substrate (not shown), a first insulating layer 13 covering the active region 12, a floating conductor 14 formed on the first insulating layer 13, a second insulating layer 15 formed on the first insulating layer 13 and the floating conductor 14, a wiring layer 16 formed on the second insulating layer 15, a third insulating layer 17 formed on the second insulating layer 15 and the wiring layer 16, a bonding pad 18 formed on the third insulating layer 17 and interconnection vias 19, 20 electrically connecting the active region 12, the wiring layer 16 and the bonding pad 18.

The active region 12 is a region where a transistor T1 having a channel layer 11a, a carrier supply layer 11b, the channel layer 11a and the carrier supply layer 11b being formed one on the other on a substrate (not shown), a source electrode 21, a drain electrode 22 and a gate electrode 23 is formed. The transistor T1 is a transistor formed by using a nitride-based compound semiconductor, the nitride being nitride of a III-group element such as gallium nitride (GaN), aluminum gallium nitride (AlGaN), or indium nitride (InN). The source electrode 21 and the drain electrode 22 are made of a metal non-limitatively selected from titanium, aluminum, gold and nickel alloys. The gate electrode 23 is made of a metal non -limitatively selected from gold, nickel, palladium, iridium, titanium, chrome, alloys of titanium and tungsten and platinum silicide.

An insulating material having a small dielectric constant such as $SiO_2$, SiN or a polyimide is employed for the first insulating layer 13, the second insulating layer 15 and the third insulating layer 17. The second insulating layer 15 needs to have a large thickness in order to reduce electrostatic capacities of the field plates 32, 33 and the floating conductor 14 of the second layer L2 and the wiring layer 16 of the third layer L3. For instance, the second insulating layer 15 may be made to show a thickness of not less than 1 µm, preferably 2 µm. The third insulating layer 17 needs to have a large thickness in order to make it show a high mechanical strength because the bonding pad 18 is formed thereon. For example, the third insulating layer 17 may be made to show a thickness of 1 µm to 3 µm, preferably 3 µm. Particularly, when the transistor T1 formed in the active region 12 is a nitride semiconductor-based compound semiconductor transistor, the thickness of each of the insulating layers is determined by considering that it needs to show a breakdown voltage of not lower than 400 V.

As shown in FIG. 4, the wiring layer 16 includes a source wiring 24 and a drain wiring 25. The metal to be used for the source wiring 24 and the drain wiring 25 is selected from aluminum, copper and titanium. The source wiring 24 and the drain wiring 25 are made to show a shape whose plan view that is broadened continuously or stepwise toward the interconnection via 20 electrically connected to the bonding pad 18. With this arrangement, it is possible to suppress any concentration of electric current near the interconnection via 20 electrically connected to the bonding pad 18 and a consequent voltage drop.

As shown in FIG. 1, the bonding pad 18 includes a source pad 26 and a drain pad 27. Metals that can be used for forming the source pad 26 and the drain pad 27 include aluminum, copper, titanium. The bonding pad 18 is made to have a thickness that provides a sufficiently high mechanical strength, which is, for example, 5 µm.

The source electrode 21 and the source wiring 24 are electrically connected to each other by source electrode-source wiring interconnection via 28. The drain electrode 22 and the drain wiring 25 are electrically connected to each other by drain electrode-drain wiring interconnection via 29. The source wiring 24 and the source pad 26 are electrically connected to each other by a source wiring-source pad interconnection via 30. The drain wiring 25 and the drain pad 27 are electrically connected to each other by drain wiring-drain pad interconnection via 31. These interconnection vias are formed by burying a metal selected from aluminum, copper, titanium or some other metal in the holes running through the insulating layers.

As shown in FIG. 5, the source electrode 21 is connected to the source field plate 32 that is made of a metal selected from aluminum, copper and titanium or some other metal, while the drain electrode 22 is connected to the drain field plate 33 that is made of a metal selected from aluminum, copper, titanium or some other metal. The floating conductor 14 is formed between the source field plate 32 and the drain field plate 33 by using a plurality of conductor pieces 14a made of a metal selected from aluminum, copper, titanium or some other metal arranged at predetermined intervals on the same plane. The floating conductor 14 reduces the influence of changes in the electric potentials of the bonding pad 18 on the transistor arranged in the active region 12.

Thus, the bonding pad 18 for drawing the source electrode 21 and the drain electrode 22 is formed above the active region 12 in the semiconductor device 10 having the above-described structure (such a bonding pad is referred to as active pad hereinafter). Unlike the conventional art, this arrangement does not require a relatively large space around the active region 12 for forming a source pad and a drain pad so that the semiconductor device can be downsized if compared with a conventional semiconductor device. Additionally, the above-described structure can be formed by means of a known multilayer wiring technique without requiring any complex process so that the electric characteristics can be prevented from being degraded.

Furthermore, the influence of electric charge on the compound semiconductor layer formed in the active region 12 below the bonding pad 18 can be alleviated by forming the floating conductor 14. Thus, it is possible to suppress any degradation of the breakdown voltage under the influence of biased electric field due to the electric potential of the bonding pad and the influence of externally provided ions and generation of electric current collapses.

Still additionally, this embodiment can alleviate any concentration of electric current near the interconnection via 20 that is electrically connected to the bonding pad 18 by forming the source wiring 24 and the drain wiring 25 so as to show a shape that is broadened toward the interconnection via 20.

Figure 6:
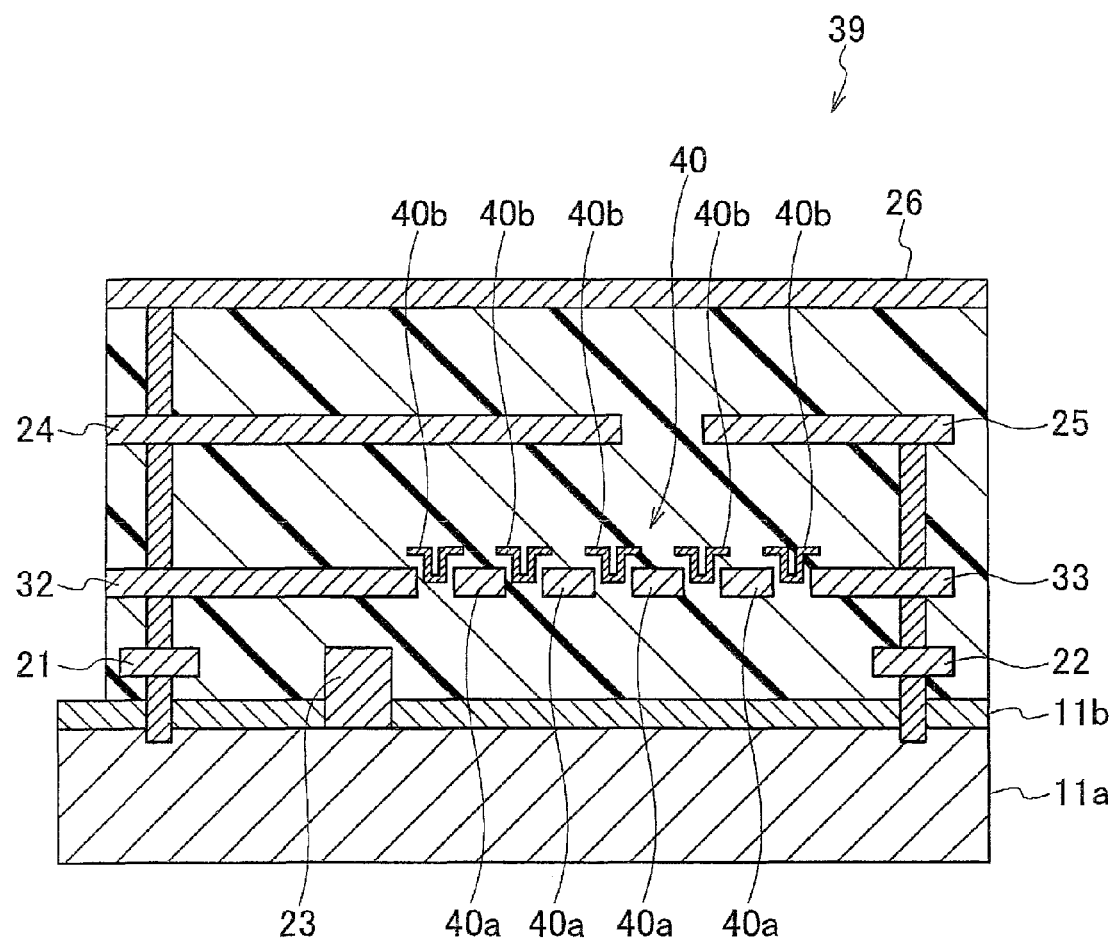
FIG. 6 is a schematic cross-sectional view of semiconductor device according to a second embodiment of the present invention.

Now, the second embodiment of semiconductor device according to the present invention will be described below. As shown in FIG. 6, the semiconductor device 39 of the second embodiment differs from the first embodiment in that the floating conductor 40 thereof has a two-layered structure and includes a plurality of first conductor pieces 40a arranged at predetermined intervals on the same plane and second conductor pieces 40b arranged in the gaps separating the first conductor pieces 40a. Otherwise, this embodiment is the same as the first embodiment and, therefore, the components same as those of the first embodiment are denoted by the same reference symbols and will not be described here repeatedly.

The first and second conductor pieces 40a, 40b are made of a metal selected from aluminum, copper, titanium or some other metal just like the conductor pieces 14a of the first embodiment. The first and second conductor pieces 40a, 40b are formed by patterning so as to partly overlap with one another as seen in plane view. The coupling capacitance of the floating conductor 40 can be raised to increase the breakdown voltage by using an insulating material showing a high dielectric constant such as $Ta_2O_5$ for the insulating layers between any adjacently located first and second conductor pieces 40a, 40b. Then, the effect of the floating conductor 40 is raised accordingly.

Thus, this embodiment can provide a downsized semiconductor device free from degradation of the characteristics attributable to the manufacturing process thereof and its characteristics are hardly affected by changes in the electric potentials of the bonding pads.

Figure 7:
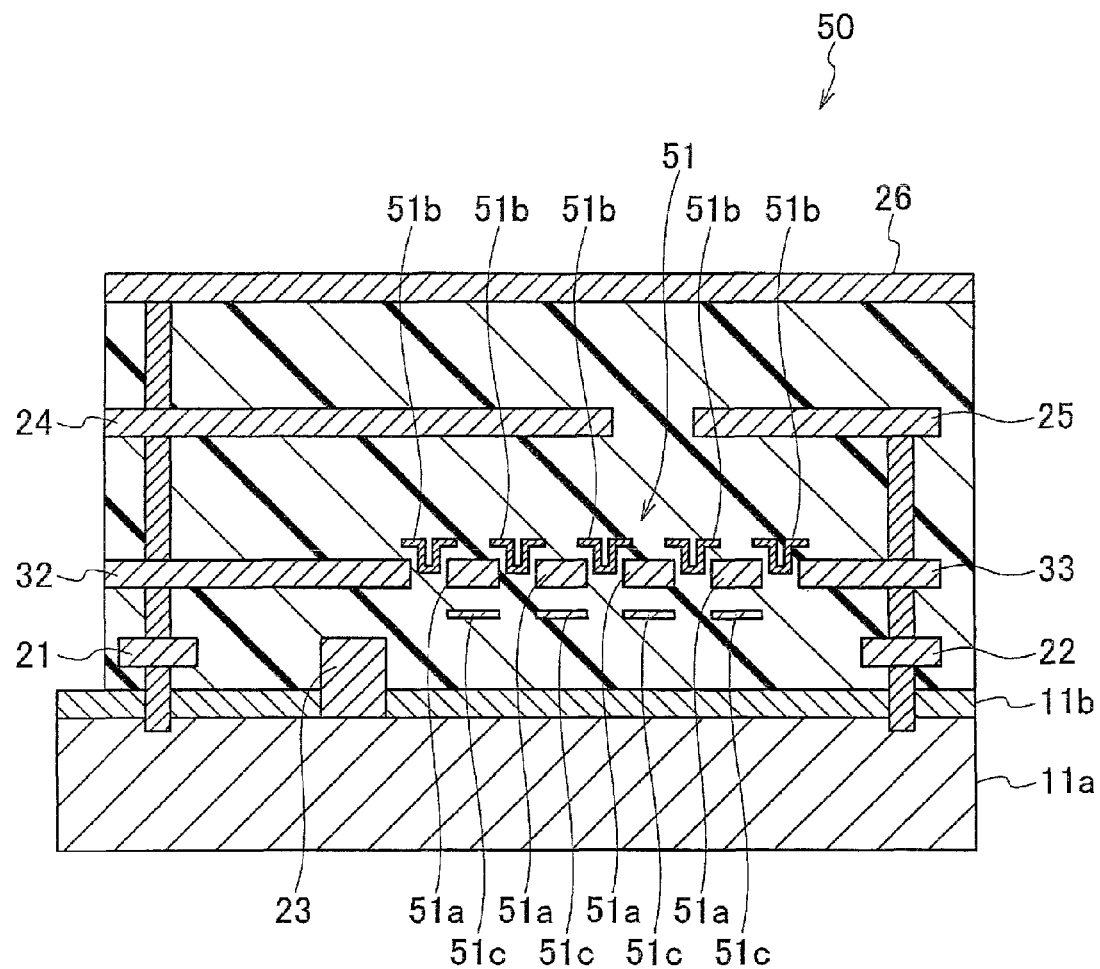
FIG. 7 is a schematic cross-sectional view of semiconductor device according to a third embodiment of the present invention.

Now, the third embodiment of semiconductor device according to the present invention will be described below. As shown in FIG. 7, the semiconductor device 50 of the third embodiment differs from the first embodiment or the second embodiment in that the floating conductor 51 thereof has a three-layered structure and includes a plurality of first conductor pieces 51a arranged at predetermined intervals on a first same plane, a plurality of second conductor pieces 51b arranged in the gaps separating the first conductor pieces 51a and a plurality of third semiconductor pieces 51c arranged on a second same plane different from the first same plane. Otherwise, this embodiment is the same as the semiconductor device described in the first or second embodiment and, therefore, the components same as those of the first embodiment are denoted by the same reference symbols and will not be described here repeatedly.

The first, second and third conductor pieces 51a, 51b, 51c are made of a metal selected from aluminum, copper, titanium or some other metal just like the conductor pieces 14a of the first embodiment. The first, second and third conductor pieces 51a, 51b, 51c are formed by patterning so as to partly overlap with one another as seen in plane view. Then, an insulating material showing a high dielectric constant such as $Ta_2O_5$ can be used for the insulating layers separating any adjacently located first, second and third conductor pieces 51a, 51b, 51c.

Thus, this embodiment of semiconductor device is free from degradation of the characteristics attributable to the manufacturing process thereof and its characteristics are hardly affected by changes in the electric potentials of the bonding pads.

The first through third embodiments of the present invention are described above summarily in terms of configuration, shape, size and positional arrangement only to such an extent that the present invention is understandable and carried out. Additionally, the numerical values and the compositions (materials) of the components listed above are only shown as examples. Therefore, the present invention is by no means limited to the above-described embodiments, which may be modified, altered and/or combined in various different ways without departing from the technical spirit and scope of the present invention.

A semiconductor device according to the present invention can find applications in the field of power elements that are required to operate at a high frequency and with a high withstand voltage.

10 semiconductor device
11 substrate
12 active region
13 first insulating layer
14 floating conductor
15 second insulating layer
16 wiring layer
17 third insulating layer
18 bonding pad
19,20 interconnection via
21 source electrode
22 drain electrode
23 gate electrode
24 source wiring
25 drain wiring
26 source pad
27 drain pad
28 source electrode-source wiring interconnection via
29 drain electrode-drain wiring interconnection via
30 source wiring-source pad interconnection via
31 drain wiring-drain pad interconnection via
32 source field plate
33 drain field plate

What is claimed is:

1. A semiconductor device in which a current flows in an active region between a first main electrode and a second main electrode formed on a substrate, and a gate electrode controlling an on/off operation of the current is formed on the substrate in the active region between the first main electrode and the second main electrode on the substrate, the semiconductor device comprising:
    a first insulating layer covering the active region in which the first main electrode, the second main electrode. and the gate electrode are formed;
    a first metal layer formed on the first insulating layer;
    a second insulating layer formed on the first metal layer;
    two bonding pads connected to the first main electrode and the second main electrode, respectively, formed on the second insulating layer;
    a plurality of first floating conductors electrically insulated from the first main electrode, the second electrode, and the gate electrode, formed by patterning the first metal layer, so that each of the first floating conductors is insulated from others of the first floating conductors, wherein,
    the two bonding pads cover the plurality of the first floating conductors that are within an area of the active region in a plan view, a first field plate connected to the first main electrode, extending toward the second main electrode, and a second field plate connected to the second main electrode, extending toward the first main electrode, are formed under the two bonding pads and over the substrate, so that the first floating conductors are formed between the first field plate and the second field plate in the plan view, and further comprising under the two bonding pads and over the first metal layer, a first main electrode wiring layer connected to the first main electrode, and a second main electrode wiring layer connected to the second main electrode, wherein, in the plan view, an interconnection via connected to the first main electrode wiring layer is formed at one end on the substrate, and another interconnection via connected to the second main electrode is formed at another end on the substrate, the first main electrode wiring layer has a configuration whose width becomes narrower towards the another end from the one end, and the second main electrode wiring layer has a configuration whose width becomes narrower towards the one end from the another end, the first main electrode wiring layer and the second main electrode wiring layer are formed alternately along a direction perpendicular to a direction from the one end toward the another end.

\* \* \* \* \*